United States Patent [19]

Ju-Zhen

[11] Patent Number: 4,800,316

[45] Date of Patent: Jan. 24, 1989

[54] BACKING MATERIAL FOR THE ULTRASONIC TRANSDUCER

[75] Inventor: Wang Ju-Zhen, Shanghai, China

[73] Assignee: Shanghai Lamp Factory, Shanghai, China

[21] Appl. No.: 140,934

[22] Filed: Dec. 22, 1987

Related U.S. Application Data

[63] Continuation-in-part of Ser. No. 737,135, May 23, 1985, abandoned.

[30] Foreign Application Priority Data

Apr. 1, 1985 [CN] China ................................ 85100483

[51] Int. Cl.$^4$ ........................ H01L 41/18; H01B 1/22; H04R 17/00

[52] U.S. Cl. .................................... 310/327; 310/334; 310/336; 73/642; 75/233; 252/515

[58] Field of Search ........................ 310/327, 334, 336; 73/642; 75/233; 252/515

[56] References Cited

U.S. PATENT DOCUMENTS 4,076,611 2/1978 Gray ................................ 204/290 F
4,083,811 4/1978 Bachmann et al. ................. 252/509
4,382,201 5/1983 Trzaskos ............................. 310/327

FOREIGN PATENT DOCUMENTS 0147360 7/1985 European Pat. Off. .............. 75/232
59-143041 8/1984 Japan .................................... 75/232

OTHER PUBLICATIONS

Sidney Lees et al., "Acoustic Properties of Tungsten-Vinyl Composites" *IEEE Transactions on Sonics and Ultrasonics,* vol. SU-20, No. 1, Jan. '73, pp. 1 and 2

Jeffrey H. Goll., "The Design of Broad-Band Fluid--Loaded Ultrasonic Transducers", *IEEE Transactions on Sonics and Ultrasonics,* vol. SU-26, No. 6,11/79, pp. 385-393.

K. F. Bainton et al., "Some Factors which Affect the Performance of Ultrasonic Transducers", *British Journal of NDT,* Jan. 1980, pp. 15-20.

J. Fleming Dias, "Construction and Performance of an Experimental Phased Array Acoustic Imaging Transducer", *Ultrasonic Imaging 3,* 1981, pp. 352-368.

Grant, "Hackh's Chemical Dictionary" 1969, p. 57.

*Primary Examiner*—John F. Terapane
*Assistant Examiner*—Eric Jorgensen
*Attorney, Agent, or Firm*—Pennie & Edmonds

[57] ABSTRACT

The invention is a backing material for an ultrasonic transducer. The backing material comprises a composite of tungsten powder, cerium oxide powder in an amount of 1.0 to 4.5% by weight tungsten, and an epoxy in a weight proportion to powder of from 4:1 to 50:1.

9 Claims, 1 Drawing Sheet

BACKING MATERIAL FOR THE ULTRASONIC TRANSDUCER

This is a continuation-in-part of application Ser. No. 737,135, filed May 23, 1985.

DESCRIPTION

1. Technical Field

The invention relates to a backing material for use in an ultrasonic transducer.

2. Background of the Invention

There are various technical requirements of a backing material for an ultrasonic transducer. According to one requirement, the mating surface between the backing material which serves as an attenuation element and a piezoelectric crystal or piezoelectric film of the ultrasonic transducer must have the same or approximately the same magnitude of acoustic impedance as that of the piezoelectric crystal or piezoelectric film. If this requirement is satisfied, reflection of acoustic energy from the mating surface will be prevented. Another requirement concerns the dissipation of acoustic energy which otherwise would enter the backing material from the piezoelectric crystal or piezoelectric film. The acoustic energy may be dissipated away in the impedance element. In this manner it is possible to avoid any reflection of acoustic energy by the back surface of the backing material. And, under circumstances that the ultrasonic transducer is fabricated with a casting material as the backing material, there is the further requirement that the backing material demonstrate the property of high resistance to voltage. Thus, the backing material will not act as a conductor of voltage between the electrodes connected to the piezoelectric crystal or piezoelectric film. This is a particularly important consideration in a transmitting mode with a phase control array transducer.

The prior art recognizes that the backing material may comprise an insulating cement composite of tungsten. It is also known that the backing material, particularly the backing material of the phase control array transducer for transmitting purposes, may be provided with an insulating film of aluminum oxide.

A patent representative of the prior art is U.S. Pat. No. 4,382,201 to Trazaskos. Trazaskos describes an ultrasonic transducer having a backing material of a tungsten-polyvinyl chloride composite capable of operation at a frequency of 4.5 MHz or higher. Trazaskos also describes the process of enhancing the acoustic attenuation of the backing material by steps, including others, of pressurizing powders of tungsten having a particle size less than 10 microns and polyvinyl chloride, degassing the powders, heating the powders under pressure, and further pressurizing the powders during cooling of the composite until it is in a state of elastic compression capable of spontaneously expanding when the pressure is released.

While certain requirements in properties can be achieved by fabricating a tungsten-polyvinyl chloride composite according to Trazaskos, or using the tungsten-insulating cement composite as a backing material, certain problems and deficiencies have also been discerned. For example, the cast backing material, in use in a general transducer capable of both transmitting and receiving ultrasound, frequently does not possess the property of resistance to both high damping and voltage. It has also been found that the cast backing material frequently permits reflection of acoustic energy which gives rise to spurious signals. In addition, it has been found that the noise level increases at frequencies of operation of the transducer of 4.5 MHz and above. Further still, it has been found that the procedure of coating an insulating film of aluminum oxide which should be controlled strictly within a few microns precision is quite complicated. The insulating film, as previously averted to, may and most likely should be used to coat the insulating cement composite of tungsten used with a phase control array transducer for transmitting purposes in order to overcome a defect in the backing material of low resistance to voltage.

SUMMARY OF INVENTION

The present invention is in a new backing material for an ultrasonic transducer which successfully overcomes the problems and disadvantages of the prior art. The invention, also, concerns the process of fabrication of the backing material having the property of resistance to voltage, as well as the property of high acoustic attenuation. Accordingly, under the conditions of construction and the procedure of the ultrasonic transducer the backing material of the invention can be fabricated in conformance with testing requirements to provide necessary acoustic impedance in improving the performance of the ultrasonic transducer.

The backing material, as will be discussed, is a tungsten-base composite including a tungsten powder, a powder of an oxide of metal from the lanthanum group and an insulating cement present in the tungsten-metallic oxide in an amount of 4:1 to 50:1.

In a more preferred form of the invention the metallic oxide is cerium oxide present in the composite in an amount of from 1.0 to 4.5% by weight, and the insulating cement is an epoxy having a weight proportion to the tungsten-cerium oxide powder of 5:1.

BRIEF DESCRIPTION OF THE DRAWING

The FIGURE is an elevational view, partly in section, of an ultrasonic transducer including the backing material of the invention.

DETAILED DESCRIPTION OF THE INVENTION

Figure 1:
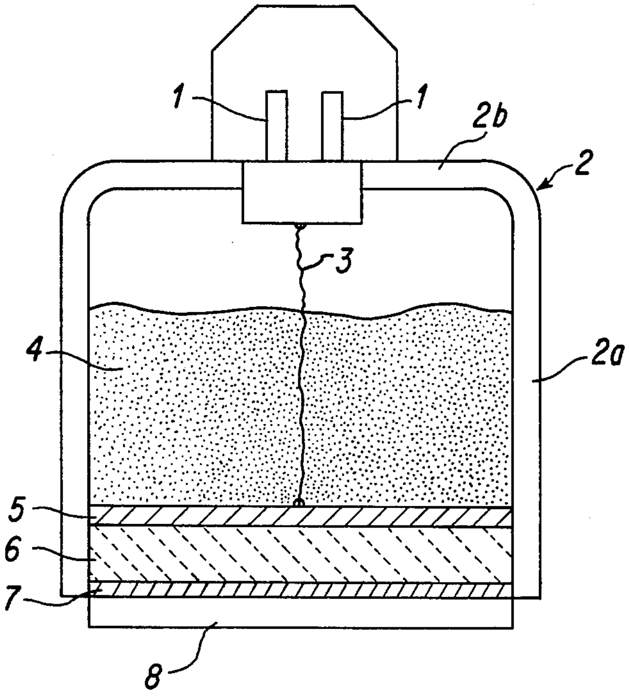

The ultrasonic transducer as seen in the FIGURE includes a housing 2 having a side wall *2a* extending to an open end and a rear wall *2b*. A pair of electrodes 1 is supported by the rear wall. A piezoelectric crystal 6 is supported at the open end of the housing. A film 5 of a conductive material and a like film 7 are applied to opposite inner and outer surfaces, respectively, of the piezoelectric crystal. A conductor is connected between an electrode and a respective film layer. One conductor 3 is illustrated in the FIGURE. A film 8 is coated on the outer surface of film 7 to provide the conductive film with a protective barrier. Finally, a backing material 4 is located within the housing juxtaposed the inner surface of film 5. Any conventional manner of support on the housing for both the electrodes and the piezoelectric crystal may be employed.

The backing material 4 is in the form of a composite of tungsten powder, metallic oxide, and an insulating cement. The metallic oxide may be an oxide of an element from the lanthanum group, and preferably, cerium oxide present in the composite in an amount of 1.0 to 4.5% by weight. More particularly, the cerium oxide will comprise an amount of 1.8 to 2.2% by weight of the composite. The maximum grain size of the tungsten-cerium powder is 7 microns. The insulating cement preferably is an epoxy, and the weight percentage of epoxy to the tungsten-cerium powder will be dependent upon operating requirements. The range of epoxy present in the tungsten-cerium powder may be from 4:1 to 50:1. The composite must be made so that the acoustic impedance will be matched to the acoustic impedance of the piezoelectric crystal or piezoelectric film.

Cerium oxide is a nonconductive material, and while tungsten is conductive the resistance of tungsten powder is very low. Thus the tungsten-cerium powder will have very high resistance. A comparative test between tungsten-cerium powder on the one hand and tungsten powder on the other hand, carried out under identical test conditions, yielded the result that the tungsten-cerium powder had a resistance a third power higher than that of tungsten powder. Therefore, a backing material formed by a composite of tungsten-cerium-epoxy, each present in a defined percentage by weight, when compared with a backing material formed by a composite of tungsten-epoxy, having a substantially identical weight property of tungsten-epoxy in the composite, will have a resistance to voltage increased many times. The test results are shown in the following Table. These test results were obtained using a tungsten-cerium-epoxy composite backing material, fabricated by a casting process. The cerium oxide content in the tungsten powder is 2% by weight, and the epoxy content in the tungsten-cerium powder is 8:1. The tungsten-epoxy backing material composite is made of substantially identical weight percentages of tungsten-epoxy, and similarly fabricated.

| | Backing Material | |
|---|---|---|
| | Tungsten-Epoxy | Tungsten-Cerium-Epoxy |
| Emitting Voltage | 9 V | 60–90 v |
| Thickness Detectable | 1.5 mm | 1.0 mm |
| Transducer acceptable ratio | 30% | 90% |

The improved properties of the tungsten-cerium-epoxy composite, in use as a backing material are evident and satisfy one of the requirements for a backing material for an ultrasonic transducer of high voltage usage as previously mentioned. On the other hand, the adhesive retarding of the tungsten-cerium-epoxy composite medium is quite different from that of the tungsten-epoxy composite medium. To this end, the tungsten-cerium-epoxy composite possesses comparatively greater acoustic attenuation, and it is also suitable for use in ultrasonic transducers of high impedance.

The process for fabricating the backing material may be either a casting or pressing process. A casting process may be preferred in the fabrication of the backing material from a small proportion of tungsten-cerium powder. Large proportions of tungsten-cerium powder are better suited for fabrication to a backing material by the pressing process. In either process, the acoustic impedance of the composite forming the backing material is matched to that of the piezoelectric crystal or piezoelectric film.

The tungsten-cerium-epoxy composite fabricated to a backing material and used in an ultrasonic detecting instrument, such as an ultrasonic thickness measuring instrument or phase control array transducer, has been found to increase the performance of operation, as well as to satisfy needs of the ultrasonic transducer. High frequency ultrasonic instruments having an ultrasonic transducer with tungsten-cerium-epoxy composite, may be used with operating frequencies above 5 MHz, with a detectable range equal to or greater than 0.2 mm. The backing material or tungsten-cerium-epoxy composite, compared with the backing material of tungsten-epoxy when tested compared as follows:

Sensitivity, residual amount increased about 10 dB (28% approximately)

Resolution, power enhancement about 5 dB (24% approximately)

Path length, width decrease about 5 mm (37% approximately)

Tests have also been carried out during use of an ultrasonic transducer in an underwater ultrasonic receiving figure system. The backing material of tungsten-cerium-epoxy composite, fabricated by a pressing process, included a cerium oxide content in the tungsten powder of 2% weight proportion and a weight proportion of the tungsten-cerium powder to epoxy of 5:1. This tungsten-cerium-epoxy composite was tested and compared with a tungsten-epoxy composite formed by the same fabricating process, having the same mixing ratios and located adjacent the piezoelectric crystal or piezoelectric film with the following results:

| | Backing Material | |
|---|---|---|
| | Tungsten-Epoxy | Tungsten-Cerium-Epoxy |
| Wave from pulse width | 3 μsec | 2 μsec |
| Wave form residual vibration | 12 μsec | 7 μsec |

It has also been found that the noise level of the tungsten-cerium-epoxy composite is lower, by about 5 times, than that of the tungsten-epoxy composite, and it has a comparatively ideal electric exciting function. Further, the tungsten-cerium-epoxy composite backing material is capable of use with an ultrasonic transducer and ultrasonic detection at both high and low frequencies.

I claim:

1. An ultrasonic transducer including a piezoelectric element, a backing element which acts as an attenuator for said piezoelectric element, a mating surface between said piezoelectric element and said backing element having approximately the same acoustic impedance as said piezoelectric element, said backing element consisting of a material in the form of a tungsten base composite comprising:

(a) tungsten (b) an oxide of metal from the lanthanum group, and (c) an insulating cement, said insulating cement present in said tungsten-metallic oxide composite by a ratio of 4:1 to 50:1% by total weight of said composite.

2. An ultrasonic transducer of claim 1 wherein the backing material includes a metallic oxide which is cerium oxide, said cerium oxide present in the composite by a ratio of 1:0 to 4:5% by total weight of said composite.

3. An ultrasonic transducer of claim 2 wherein the backing material includes a cerium oxide present in the composite by a ratio of 1.8 to 2.0% by total weight of said composite.

4. An ultrasonic transducer of claim 1 wherein said insulating cement is an epoxy.

5. An ultrasonic transducer of claim 4 wherein said metallic oxide is cerium powder, and the weight proportion of the tungsten-cerium oxide to epoxy is 5:1.

6. An ultrasonic transducer of claim 5 wherein the cerium oxide content in the tungsten powder is 2% by total weight of said composite.

7. An ultrasonic transducer of claim 1 wherein both said tungsten and oxide of metal from the lanthanum group are in powder form.

8. An ultrasonic transducer of claim 7 wherein said metallic oxide is cerium oxide, said cerium oxide present in the composite by a ratio of 1:0 to 4:5% by total weight of said composite.

9. An ultrasonic transducer of claim 8 wherein the grain size of the cerium powder is no greater than 7 microns.

* * * * *

UNITED STATES PATENT AND TRADEMARK OFFICE
CERTIFICATE OF CORRECTION

PATENT NO. : 4,800,316

DATED : Jan. 24, 1989

INVENTOR(S) : Ju-Zhen Wang

It is certified that error appears in the above-identified patent and that said Letters Patent is hereby corrected as shown below:

Please amend the Inventor's name as follows:

Change "Wang Ju-Zhen" to --Ju-Zhen Wang--.

Item [19]: "Ju-Zhen" should read --Wang--.

Signed and Sealed this

Fifth Day of September, 1989

*Attest:*

DONALD J. QUIGG

*Attesting Officer*

*Commissioner of Patents and Trademarks*